United States Patent
Berke et al.

(10) Patent No.: US 10,469,291 B2
(45) Date of Patent: Nov. 5, 2019

(54) SYSTEM AND METHOD TO OPTIMIZE EQUALIZATION COEFFICIENTS IN A HIGH-SPEED SERIAL INTERFACE

(71) Applicant: DELL PRODUCTS, LP, Round Rock, TX (US)

(72) Inventors: Stuart Allen Berke, Austin, TX (US); Minchuan Wang, Austin, TX (US); Bhyrav M. Mutnury, Austin, TX (US)

(73) Assignee: Dell Products, LP, Round Rock ( * ) Notice: Subject to any disclaimer, the term of this patent is extended or adjusted under 35 U.S.C. 154(b) by 0 days.

(21) Appl. No.: 15/924,925

(22) Filed: Mar. 19, 2018

(65) Prior Publication Data
US 2019/0288881 A1    Sep. 19, 2019

(51) Int. Cl.
*H03H 7/30* (2006.01)
*H04L 25/03* (2006.01)
*H03G 3/00* (2006.01)

(52) U.S. Cl.
CPC ....... *H04L 25/03019* (2013.01); *H03G 3/001* (2013.01); *H04L 25/03267* (2013.01); *H04L 25/03343* (2013.01); *H04L 25/03885* (2013.01)

(58) Field of Classification Search
CPC ......... H04L 25/03019; H04L 25/03267; H04L 25/03343; H04L 25/03885; H03G 3/001
USPC ........................ 375/230, 229, 316, 219, 295
See application file for complete search history.

(56) References Cited

U.S. PATENT DOCUMENTS

| | | |
|---|---|---|
| 5,341,249 A | 8/1994 | Abbott et al. |
| 9,565,037 B1 | 2/2017 | Liu et al. |
| 2009/0219978 A1 | 9/2009 | Mobin et al. |
| 2016/0105296 A1* | 4/2016 | Berke ............... H04L 25/03057 375/233 |
| 2016/0134443 A1* | 5/2016 | Berke ............... H04L 25/03885 375/232 |

* cited by examiner

*Primary Examiner* — Zewdu A Kassa
(74) *Attorney, Agent, or Firm* — Larson Newman, LLP

(57) ABSTRACT

A high-speed serial data system includes a transmitter and a receiver. The receiver includes a compensation module, a memory, and a control module. The compensation module includes a setting that selects a compensation value from among a plurality of compensation values for a characteristic of the receiver. The memory stores a whitelist value from among the compensation values. The control module determines that a performance level of the receiver is below a performance level threshold. In response to determining that the performance level is below the performance level threshold, the control module uses the whitelist value to reevaluate the performance level of the receiver, and applies the whitelist value to the compensation module when the reevaluated performance level is above the performance level threshold.

19 Claims, 4 Drawing Sheets

SYSTEM AND METHOD TO OPTIMIZE EQUALIZATION COEFFICIENTS IN A HIGH-SPEED SERIAL INTERFACE

FIELD OF THE DISCLOSURE

This disclosure generally relates to information handling systems, and more particularly relates to a system and method to optimize equalization coefficients in a high-speed serial interface.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

As the speed of serial interfaces increases, variations in circuit design, component manufacture, environmental conditions, and other factors make it increasingly difficult to ensure highly reliable data transmission. In particular, transmitter and receiver equalization mechanisms to compensate for channel loss are calibrated on a best-effort basis, where settings that result in a "good enough" compensation solution are quickly obtained, in favor of iterative processes that might yield a more optimal solution, but which require an inordinate amount of time for such link training.

High-speed serial data interface therefore may include a transmitter and a receiver. The receiver may include a compensation module, a memory, and a control module. The compensation module may include a setting that selects a compensation value from among a plurality of compensation values for a characteristic of the receiver. The memory may store a whitelist value from among the compensation values. The control module may determine that a performance level of the receiver is below a performance level threshold. In response to determining that the performance level is below the performance level threshold, the control module may use the whitelist value to reevaluate the performance level of the receiver, and apply the whitelist value to the compensation module when the reevaluated performance level is above the performance level threshold.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
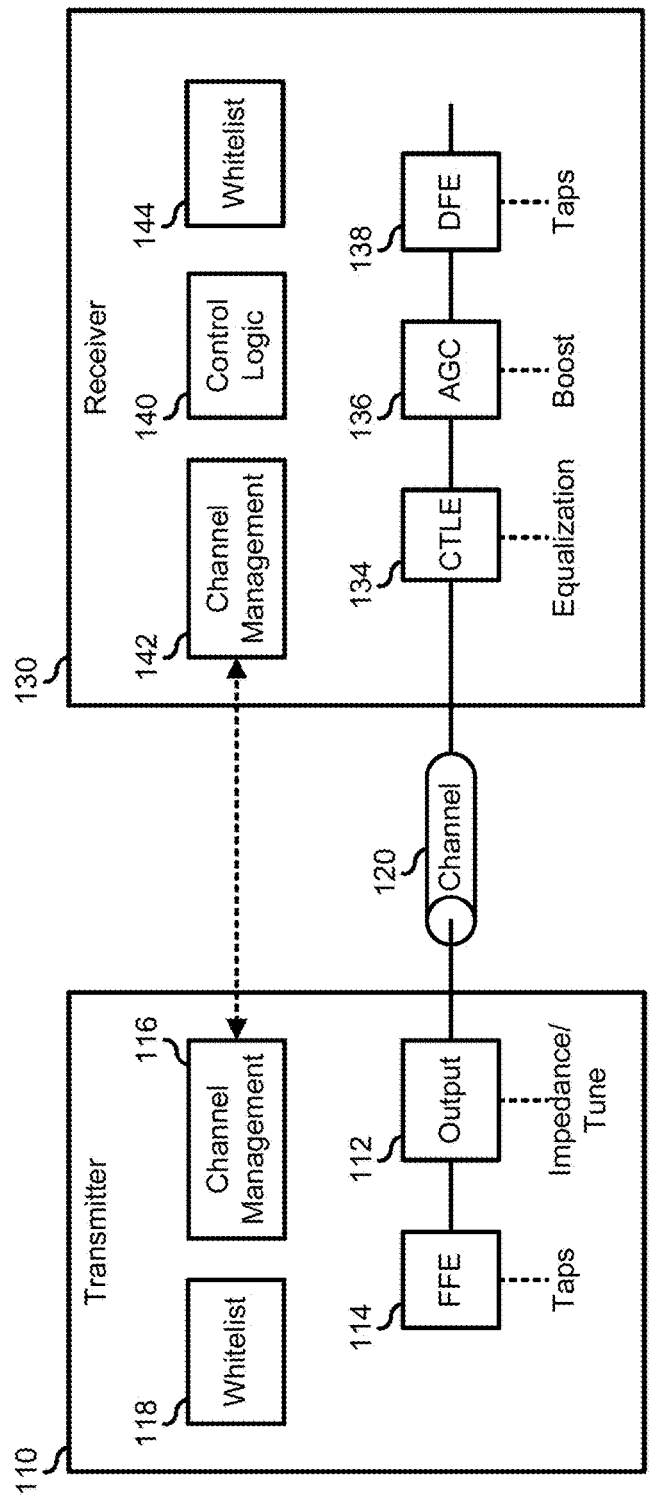
FIG. 1 is a schematic diagram of a high speed serial interface according to an embodiment of the present disclosure.

FIG. 1 illustrates an embodiment of a high speed serial channel 100 of an information handling system. Serial channel 100 includes a transmitter 110, a transmission channel 120, and a receiver 130. Serial channel 100 represents one half of a bi-directional serial data link for communicating data from transmitter 110 located at a first component to receiver 130 located at a second component. The other half of the bi-directional serial data link is similar to serial channel 100, but with a receiver in the first component, and a transmitter in the second component, for communicating data back from the second component to the first component. Here, the components can be understood to include elements within an information handling system, such as components that are attached to one or more printed circuit board of the information handling system, where transmission channel 120 can represent one or more circuit traces on the printed circuit board, and can include one or more connectors. The components can also be understood to include devices of an information handling system, such as a hard drive, a storage array, and the like, that are separate from the printed circuit board of the information handling system, where transmission channel 120 can include one or more transmission cables. An example of serial channel 100 includes a PCI-Express (PCIe) channel that is in compliance with one or more PCIe specification, up to, and including the PCIe 4.0 Specification, a Serial ATA (SATA) channel that is in compliance with one or more SATA specification, up to, and including the SATA 3.3 Specification, a SAS channel that is in compliance with one or more SAS specification, up to and including the Serial Attached SCSI 4.0 Standard, or another high speed serial channel.

Serial channel 100 operates to provide back channel adaptation where transmitter 110 and receiver 130 communicate with each other to optimize and adjust various compensation values within the transmitter and the receiver to compensate for the insertion loss and other signal degradations of transmission channel 120. A determination is made as to whether or not a set of compensation values is satisfactory. In a particular embodiment, the determination is based upon the bit error rate (BER) associated with the set of values. In another embodiment, the determination is based upon the characteristics of the receiver eye pattern for the transmitted signals. It is possible for multiple different sets of compensation values to result in acceptable BER or receiver eye characteristics in serial channel 100. Moreover, even on a particular information handling system, operating at different times, the back channel adaptation mechanism may operate to provide different sets of compensation values based upon minute variations in the operating condition of the information handling system.

Transmitter 110 includes a channel output module 112, feed-forward equalization (FFE) module 114, a channel management module 116, and an equalization coefficient whitelist 118. Channel output module 112 includes an impedance/tuning setting. The impedance setting operates to select a target impedance for the output of receiver 110. For example, the impedance setting can operate to select a 25 ohm output impedance, a 40 ohm output impedance, a 50 ohm output impedance, a 75 ohm output impedance, or another output impedance selected to match an impedance of transmission channel 120, as needed or desired. The tuning setting operates to select a fine tuning of the output impedance of transmitter 110 around the nominal impedance selected by the impedance setting. In a particular embodiment, the tuning setting provides a low impedance adjustment setting, a nominal setting, and a high impedance adjustment setting. For example, the low impedance adjustment setting can decrease the output impedance of channel output module 122 by a particular impedance value or percentage, and the high impedance adjustment setting can increase the output impedance of channel output module 122 by a particular impedance value or percentage. In another embodiment, the tuning setting provides more or less than three impedance adjustment settings, as needed or desired.

FFE module 114 operates to proactively provide compensation to a transmitted signal by pre-distorting or shaping the data over several bit periods in order to invert the channel loss/distortion introduced by transmission channel 120. The amount of compensation is determined by enabling a number of circuit feed-forward taps. For example, FFE module 114 can support up to 16 taps that provide compensation based upon up to 16 subsequent data points. In a particular embodiment, FFE module 114 can be turned off, thereby reducing the power consumed by transmitter 110. In another embodiment, one or more tap of FFE module 114 can be turned on based upon the taps setting, while the rest of the taps are placed into a tri-state condition, that is, with power applied, but with the taps not providing compensation to the resultant FFE compensation. In yet another embodiment, one or more tap of FFE module 114 can be turned on based upon the taps setting, while the rest of the taps are turned off, thereby reducing the power consumed by transmitter 110. Other numbers of taps can be utilized, as needed or desired. Channel management module 116 will be described below.

Receiver 130 includes a continuous time linear equalization (CTLE) module 134, an automatic gain control (AGC) module 136, a decision feedback equalization (DFE) module 138, a control logic module 140, a channel management module 142, and an equalization coefficient whitelist 144. In operation, serial data is received from transmitter 110, the received signal is provided to CTLE module 134, and the CTLE module operates to provide compensation for inter-signal interference (ISI) in order to open the signal eye of the received signal. The amount of compensation is determined based upon an equalization setting. For example, receiver 130 can support 21 CTLE equalization settings which each prescribe a different amount of equalization, from 0 dB to 10 dB, in 0.5 dB steps. Other numbers of settings and amounts of equalization prescribed by the equalization setting can be utilized, as needed or desired.

The equalized signal is provided from CTLE module 134 to AGC module 136. AGC module 136 operates to provide linear gain to the signal received from CTLE module 134 to further open the signal eye of the received signal. The amount of gain is determined by a gain setting, and can support 21 gain settings which each prescribe a different amount of gain, for example, from 0 dB to 10 dB, in 0.5 dB steps. Other numbers of settings and amounts of gain prescribed by the gain setting can be utilized, as needed or desired. In a particular embodiment, AGC 136 operates to provide linear gain in two or more frequency ranges. For example, AGC 136 can include a first gain setting for low frequency gain and a second gain setting for high frequency gain, and each setting can support 21 gain settings which each prescribe a different amount of gain, for example, from 0 dB to 10 dB, in 0.5 dB steps. Other numbers of settings and amounts of gain prescribed by the gain settings can be utilized, as needed or desired.

The amplified signal is provided from AGC module 136 to DFE module 138. DFE module 138 operates to provide feedback based compensation to the received signal. The amount of compensation is determined by enabling a number of circuit feedback taps. For example, DFE module 138 can support up to 16 taps that provide compensation based upon up to 16 previous data points. In a particular embodiment, DFE module 138 can be turned off, thereby reducing the power consumed by receiver 130. In another embodiment, one or more tap of DFE module 138 can be turned on based upon the taps setting, while the rest of the taps are placed into a tri-state condition, that is, with power applied, but with the taps not providing feedback to the resultant DFE compensation. In yet another embodiment, one or more tap of DFE module 138 can be turned on based upon the taps setting, while the rest of the taps are turned off, thereby reducing the power consumed by receiver 130. Other numbers of taps can be utilized, as needed or desired.

In operation, the impedance setting of channel output module 112 is set based upon a design target for transmission channel 120. For example, if transmission channel 120 is designed as a 85 ohm transmission channel, then the impedance setting is set to the 85 ohm setting, and so forth. Control logic module 140 operates to direct transmitter 110 to set the tuning setting to the minimum offset setting, such as a minus one ohm setting. Control logic module 140 communicates with transmitter 110 via a communication channel established between channel management module 116 and channel management module 142. In a particular embodiment, management module 116 and channel management module 142 represent a separate side-band communication channel for communicating adaptation instructions between transmitter 110 and receiver 130. For example, the communications between channel management module 116 and channel management module 142 can include a third party device or mechanism that provides system management for an information handling system that includes serial channel 100, such as a Baseboard Management Controller (BMC), an Integrated Dell Remote Access Controller (IDRAC), or another embedded controller, as needed or desired. In another embodiment, management module 116 and channel management module 142 represent management traffic between transmitter 110 and receiver 130 that is communicated over transmission channel 120 and an additional transmission channel from receiver 130 to transmitter 110. An example of control logic module 140 includes hardware circuitry of receiver 130 configured to provide the functionality as described herein. Another example of control logic module 140 includes a more generalized hardware processing function of receiver 130 that is configurable to provide the functionality as described herein. Such a generalized hardware processing function may utilize instructions that are hard coded into receiver 130 or firmware that can be stored in the receiver or provided thereto, as needed or desired.

With the tuning setting of channel output module 112 set to the minimum offset setting, control logic module 140 trains transmitter 110 and receiver 130 by running through the various combinations of settings for the equalization setting, the gain settings, the DFE taps settings, and the FFE tap settings, and recording for each combination, an associated eye height and eye width, or an associated BER, as needed or desired. Control logic module 140 continues the training by directing transmitter 110 to select a next tuning setting of channel output module 112 and repeating the process of recording the associated eye height or BER for each of the various combinations of settings. Control logic module 140 continues the process of recording the associated eye height or BER for all tuning setting of channel output module 112. Based upon the recorded eye heights or BERs, control logic module 140 determines a best set of tuning coefficients, and directs transmitter 110 to set the tuning coefficients to the best setting.

The converged tuning coefficients derived from the running of the training algorithm used by control logic module 140 often differ from run to run. This may be because of variables in the environment, such as the temperature of serial channel 100, the operating voltages of transmitter 110 and receiver 130, voltage transients, cross talk from other nearby serial channels, random noise, and other effects that are not deterministic and not reproducible. As such, control logic module 140 may repeat the training algorithm multiple times to derive a final converged set of tuning coefficients.

Figure 2:
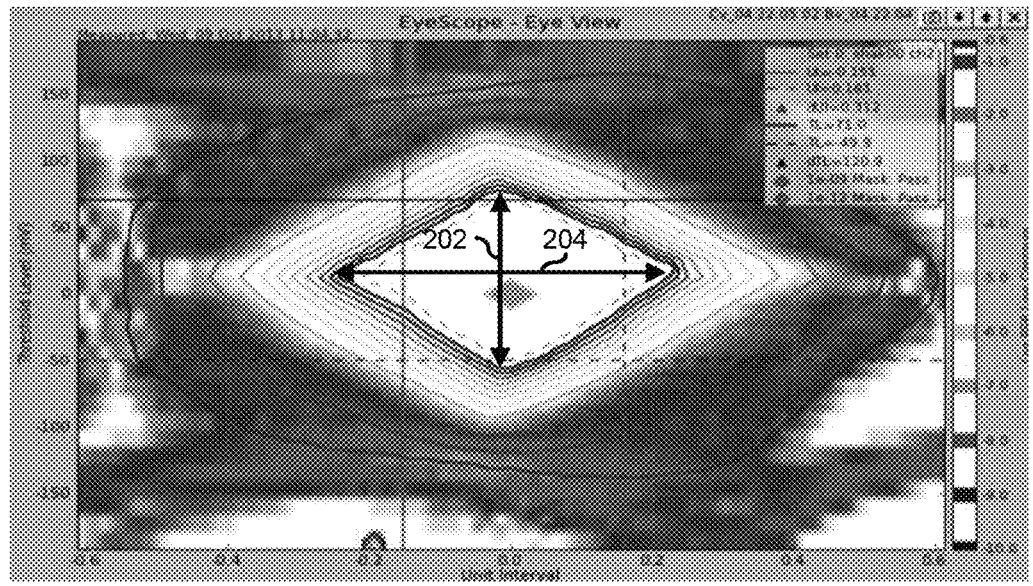
FIG. 2 is a receiver eye diagram for the serial interface of FIG. 1.
Figure 2:
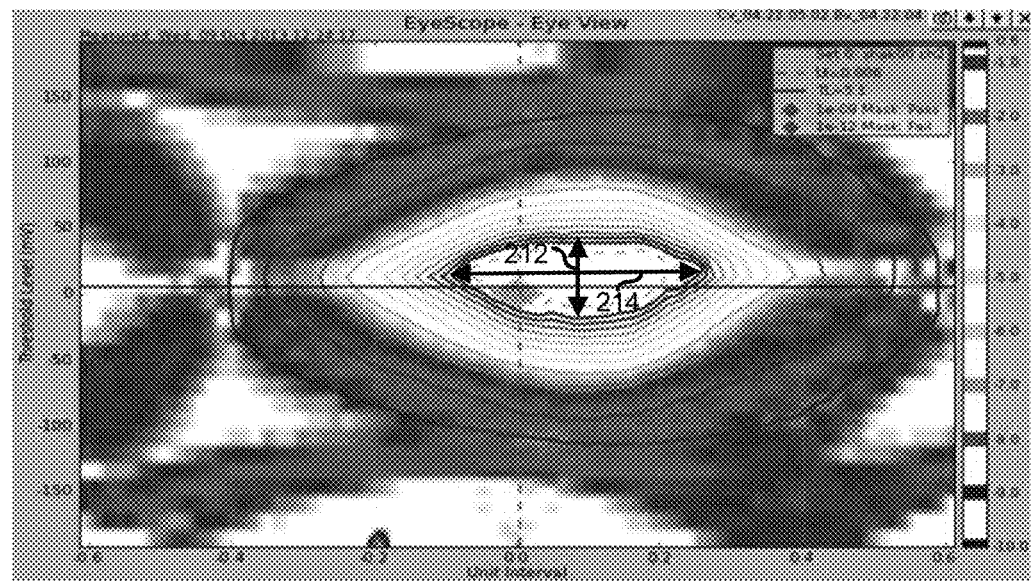

FIG. 2 illustrates the variability in determining tuning coefficients in exemplary receiver eye diagrams 200 and 210 for serial channel 100. Receiver eye diagram 200 shows an eye height 202 and an eye width 204. Serial channel 100 can be specified such that the received signal exhibits eye height 202 as being greater than or equal to a specified eye height and such that the received signal exhibits an eye width 204 as being greater than or equal to a specified eye width. Receiver eye diagram 200 is derived from a training run that determined a set of equalization coefficients as shown in the table accompanying receiver eye diagram 200. Receiver eye diagram 210 shows an eye height 212 and an eye width 214. Receiver eye diagram 210 is derived from a different training run that determined a set of equalization coefficients as shown in the table accompanying receiver eye diagram 210. Eye height 212 may be greater than or equal to the specified eye height and eye width 214 may be greater than or equal to the specified eye width. However, it is clear that when serial channel 100 is configured with the equalization coefficients associated with receiver eye diagram 200, the serial channel will operate with greater signal margin and will exhibit a lower BER than when the serial channel is configured with the equalization coefficients associated with receiver eye diagram 210.

However, the number of possible variations in the tuning coefficients is very large. For example, assuming CTLE module 134, each of a low frequency gain and a high frequency gain of AGC module 136, and each of 15 taps of DFE module 138 all have 10 possible settings, then the set of all possible variations in the tuning coefficients is equal to $10^{18}$ sets. Further, the number of settings for each module is increasing as signal margining on serial channel 100 becomes more critical to system performance. As such, the amount of time needed to fully train serial channel 100, and to ensure that the set of equalization coefficients associated with receiver eye diagram 200 are selected rather than the set of equalization coefficients associated with receiver eye diagram 210, becomes exceedingly long.

In a particular embodiment, control logic module 140 operates to determine if the variability in equalization coefficients derived over different runs of the training algorithm is greater than an equalization variation threshold. If not, the set of equalization coefficients associated with the best performance of serial channel 100, that is, the set of equalization coefficients that resulted in the highest eye height and eye width, or that resulted in the lowest BER, is selected, and normal data transmission operation is commenced on serial channel 100. If the variability is greater than the equalization variation threshold, then control logic module 140 commences a set of training runs that are targeted to determining a small number of variables in the equalization coefficients that, when altered from one setting to another, produce a wide variance in the measured performance of serial channel 100, in terms of eye height and width, or in terms of BER.

For example, control logic module 140 can identify a particular knob or set of knobs which, when set with different settings, results in a widely varying BER. In a particular embodiment, control logic module 140 can perform multiple training runs with a standard set of equalization coefficients for all but one knob, each of the multiple training runs varying the setting of the one knob. A difference between the performance of serial channel 100 can be characterized for each run, and various statistical calculations, such as standard deviation, linearity, and the like, can be applied to the results to determine the variability of the serial channel based upon the particular knob. The other knobs can each be characterized in turn, and the results between the knobs compared to determine which of the knobs result in the highest variability in the resulting channel performance.

When a particular knob or set of knobs are identified as producing wide variability in the resulting channel performance, control logic module 140 determines a narrowed set of knob settings for each knob, the set of knob settings being associated with the best channel performance, and then, in future runs of the training algorithm, control logic module 140 only utilizes the narrowed set of knob settings for the selected knobs to converge on a best set of equalization settings. In a particular case, control logic module 140 again operates to determine if the variability in equalization coefficients derived over different runs of the training algorithm with the narrowed set of settings for the selected knobs is still greater than the equalization variation threshold, the control logic module then commences another set of training runs targeted to determining another set of variables in the equalization coefficients that, when altered from one setting to another while utilizing the previously narrowed set of knob settings, produce a wide variance in the measured performance of serial channel 100, in terms of eye height and width, or in terms of BER.

Figure 3:
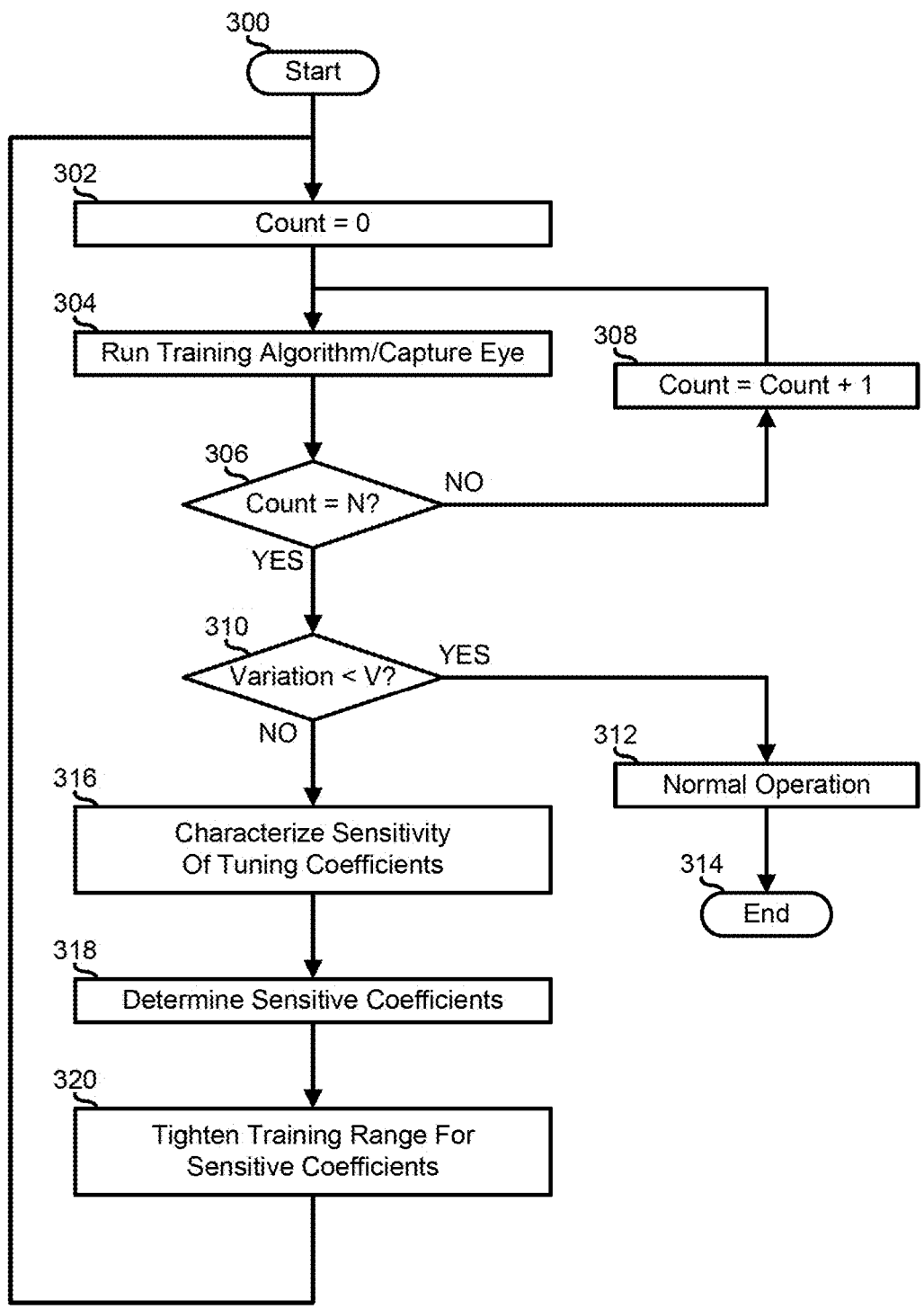
FIG. 3 is a flowchart illustrating a method of method for providing narrowed equalization coefficients for training a high speed serial interface according to an embodiment of the present disclosure.

FIG. 3 illustrates a method for providing narrowed equalization coefficients for training a serial channel, starting in block 300. A training counter in a receiver is set to zero (0) in block 302. The receiver runs a serial channel training algorithm and captures the receiver eye diagram in block 304. In the alternative, the receiver can determine the BER based upon the result of running the training algorithm in block 304. A decision is made as to whether the training counter is equal to a number (N) of training runs in decision block 306. If not, the "NO" branch of decision block 306 is taken, the training counter is incremented in block 308, and the method returns to block 304 where the receiver re-runs the serial channel training algorithm and re-captures the receiver eye diagram.

If the training counter is equal to the number (N) of training runs, the "YES" branch of decision block 306 is taken and a decision is made as to whether the variation in the receiver eye heights for the N training runs is less than a variation threshold (V) in decision block 310. If so, the "YES" branch of decision block 310 is taken, normal operation on the serial channel is commenced in block 312, and the method ends in block 314. If the variation in the receiver eye heights for the N training runs is not less than the variation threshold (V), the "NO" branch of decision block 310 is taken and the receiver characterizes the sensitivity of the tuning coefficients in block 316. The receiver determines the most sensitive knobs and coefficients in block 318 and tightens the training range for the most sensitive knobs and coefficients in block 320. Finally the method returns to block 302 where the training algorithm is restarted by setting the training counter to zero (0).

In another embodiment, when the variability in the equalization coefficients derived over different runs of the training algorithm is greater than the equalization variation threshold, then control logic module 140 refers to one or more pre-determined high variable knobs and performs the training of serial channel 100 based upon a narrowed set of knob settings for the pre-determined knobs. For example, through the design and validation process for a particular serial channel, it may become clear that changes to the CTLE settings may result in widely varying performance on the serial channel. Here, when the variability in the equalization coefficients is greater than the equalization variation threshold, control logic module 140 can forego the characterization of sensitivity of the various knobs. Instead, control logic module directly narrows the settings on the pre-determined high variable knobs and re-runs the training algorithm based upon the narrowed knob settings.

In a particular embodiment, transmitter 118 and receiver 120 include respective equalization coefficient whitelists 116 and 144. Serial channel 100 can exhibit sensitivity such that small changes in the equalization settings results in large changes in the received signal, and can lead to unacceptable eye heights and eye widths. In a particular embodiment, certain equalization coefficient settings or combinations of equalization coefficient settings are known to produce one or more of a particularly robust eye height or eye width, and such known coefficient settings or combinations of coefficient settings are stored in equalization coefficient whitelists 116 and 144. Here, serial channel 100 operates such that, in running the training algorithm for the serial interface, control logic module 140 utilizes the coefficient settings or combinations of coefficient settings stored in equalization coefficient whitelists 116 and 144 as a starting point for running the training algorithm. In a particular embodiment, the whitelisted coefficient settings or combinations of coefficient settings can be determined based upon knowledge gained during the design, development, or manufacturing of serial channel 100, and are stored in equalization coefficient whitelists 116 and 144 prior to installation into an information handling system. An example of equalization coefficient whitelists 116 and 144 may include a register or group of registers of transmitter 110 and receiver 130, a memory element of the transmitter and the receiver, another date storage element of the transmitter and receiver, or a combination thereof.

In another embodiment, other coefficient settings or combinations of coefficient settings that result in particularly robust eye heights or eye widths can be determined based upon knowledge gained during normal operation of serial channel 100. For example, control logic module 140 can track when a particular coefficient setting or combination of coefficient settings exhibits a particularly low BER, that is, the number or errors detected over time remains low, indicating that the particular coefficient setting or combination of coefficient settings is more robust. In this case, control logic module 140 can save the coefficient setting or combination of coefficient settings to equalization coefficient whitelists 118 and 144 when the BER experienced on serial channel 100 is lower than a robust BER threshold.

In another embodiment, control logic module 140 operates to providing narrowed equalization coefficients for training serial channel 100 in accordance with the method shown in FIG. 3. Here however, rather than halting the search for the most sensitive knobs when the variation in the receiver eye heights for the N training runs is less than the variation threshold (V), control logic module 140 continues to characterize the sensitivity of all of the knobs and settings. Then, when all of the knobs and settings have been characterized, control logic module 140 determines a whitelist set of equalization coefficients based upon the characterizations, and stores the whitelist set of equalization coefficients to equalization coefficient whitelists 118 and 144.

In another embodiment, after a first whitelist set of equalization coefficients is utilized for training serial channel 100, control logic module 140 operates to monitor the performance of the serial channel. For example, control logic module 140 can monitor the receiver eye diagrams to monitor that the eye height and eye width remain within specified thresholds, or can monitor that a BER of serial channel 100 remains below a specific BER threshold. If the performance of serial channel 100 falls below the desired performance level, then control logic module 140 selects a second whitelist set of equalization coefficients from equalization coefficient whitelists 118 and 144 and utilizes the second whitelist set of equalization coefficients to retrain the serial channel.

Figure 4:
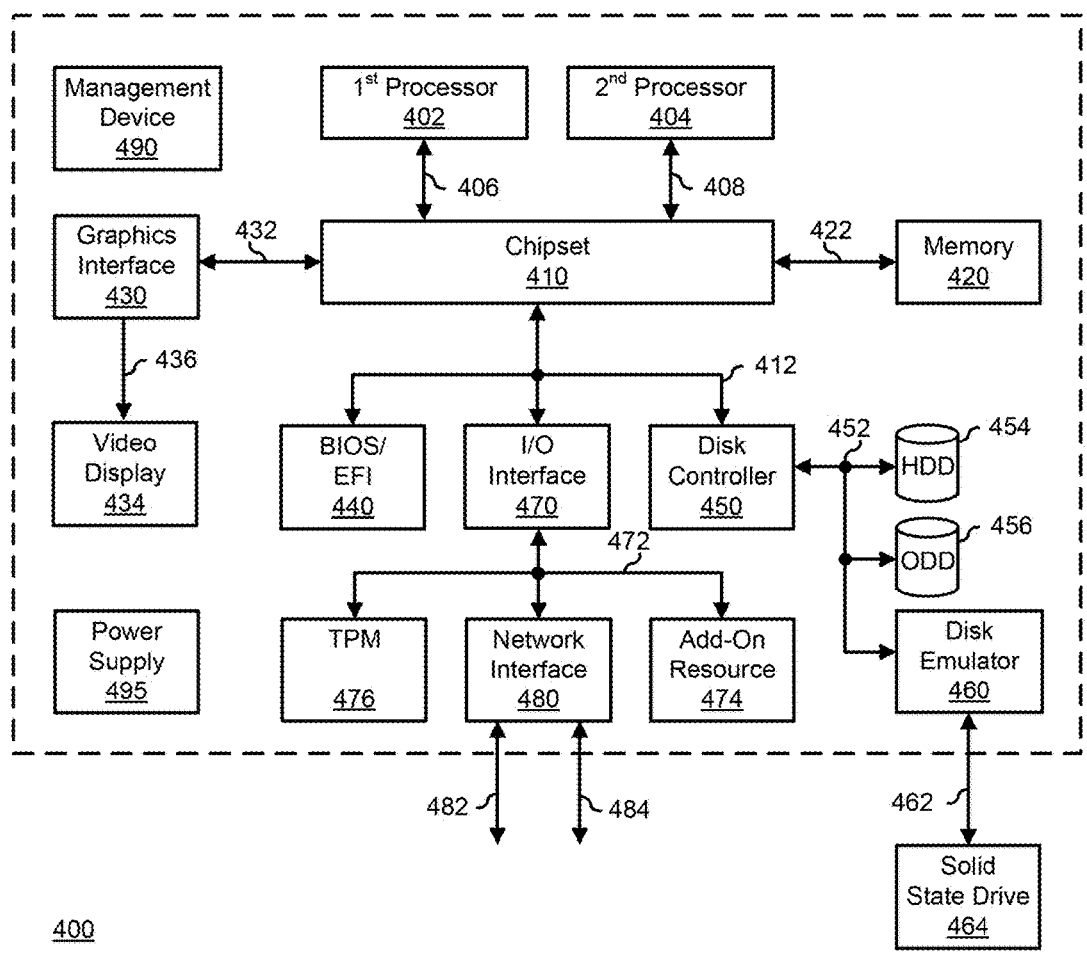
FIG. 4 is a block diagram illustrating a generalized information handling system according to an embodiment of the present disclosure.

FIG. 4 illustrates a generalized embodiment of information handling system 400. For purpose of this disclosure information handling system 400 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described above, and operates to perform one or more of the methods described above. Information handling system 400 includes a processors 402 and 404, a chipset 410, a memory 420, a graphics interface 430, include a basic input and output system/extensible firmware interface (BIOS/EFI) module 440, a disk controller 450, a disk emulator 460, an input/output (I/O) interface 470, and a network interface 480. Processor 402 is connected to chipset 410 via processor interface 406, and processor 404 is connected to the chipset via processor interface 408. Memory 420 is connected to chipset 410 via a memory bus 422. Graphics interface 430 is connected to chipset 410 via a graphics interface 432, and provides a video display output 436 to a video display 434. In a particular embodiment, information handling system 400 includes separate memories that are dedicated to each of processors 402 and 404 via separate memory interfaces. An example of memory 420 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 440, disk controller 450, and I/O interface 470 are connected to chipset 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 410 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/EFI module 440 includes BIOS/EFI code operable to detect resources within information handling system 400, to provide drivers for the resources, initialize the resources, and access the resources. BIOS/EFI module 440 includes code that operates to detect resources within information handling system 400, to provide drivers for the resources, to initialize the resources, and to access the resources.

Disk controller 450 includes a disk interface 452 that connects the disc controller to a hard disk drive (HDD) 454, to an optical disk drive (ODD) 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits a solid-state drive 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O interface 470 includes a peripheral interface 472 that connects the I/O interface to an add-on resource 474, to a TPM 476, and to network interface 480. Peripheral interface 472 can be the same type of interface as I/O channel 412, or can be a different type of interface. As such, I/O interface 470 extends the capacity of I/O channel 412 when peripheral interface 472 and the I/O channel are of the same type, and the I/O interface translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as chipset 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A high-speed serial data system, comprising:
    a transmitter configured to provide a selectable output impedance, the output impedance being selectable from a plurality of output impedance values; and
    a receiver including:
        a first compensation module with a first setting that selects a first value from among a plurality of first values for a first characteristic of the receiver;
        a memory to store a first whitelist value from among the first values; and
        a control module to determine that a performance level of the receiver is below a performance level threshold, and in response to determining that the performance level is below the performance level threshold 1) to use the first whitelist value to reevaluate the performance level of the receiver, and 2) to apply the first whitelist value to the first compensation module when the reevaluated performance level is above the performance level threshold.

2. The serial data system of claim 1, the receiver further including:
    a second compensation module with a second setting that selects a second value from among a plurality of second values for a second characteristic of the receiver;
    wherein:
        the memory is further to store a second whitelist value from among the second values, the second whitelist value being stored in combination with the first whitelist value; and
        in further response to determining that the performance level is below the performance level threshold, the control module is to 1) use the second whitelist value in combination with the first whitelist value to reevaluate the performance level of the receiver, and 2) apply the second whitelist value to the second compensation module when the reevaluated performance level is above the performance level threshold.

3. The serial data system of claim 1, wherein the first whitelist value is a predetermined whitelist value that is stored in the memory when the receiver is manufactured.

4. The serial data system of claim 1, wherein the first whitelist value is derived by the control module based upon runs of a training algorithm that trains the serial data system to maximize the performance level.

5. The serial data system of claim 1, wherein the first compensation module comprises one of a continuous time linear equalizer, an automatic gain control, and a decision feedback equalizer.

6. The serial data system of claim 1, wherein the performance level is determined based upon a receiver eye diagram of a received signal by the receiver, and wherein the receiver eye diagram is generated by the control module.

7. The serial data system of claim 6, wherein the performance level is further determined based upon an eye height of the receiver eye diagram.

8. The serial data system of claim 6, wherein the performance level is further determined based upon an eye width of the receiver eye diagram.

9. The serial data system of claim 1, wherein the performance level is determined based upon a bit error rate of the serial data system.

10. The serial data system of claim 1, wherein the serial data system comprises one of a PCI-Express (PCIe) interface, a Serial ATA (SATA) interface, a Serial Attached SCSI (SAS) interface, and a High Definition Multimedia Interface (HDMI) interface.

11. A method of training a high-speed serial data interface, the method comprising:
    setting, by a control module of a receiver of the high-speed serial data interface, an output impedance of a transmitter coupled to the receiver via the high-speed serial data interface, the output impedance being selectable from a plurality of output impedance values;
    determining, by the control module, that a performance level of the receiver is below a first performance level threshold;
    setting, by the control module, a first setting of a first compensation module of the receiver with a first whitelist value in response to determining that the performance level of the receiver is below the performance level threshold, the first compensation module to control a first characteristic of the receiver, the first whitelist value from a plurality of first values of the first setting, and the first whitelist value stored in a memory of the receiver;
    reevaluating the performance level of the receiver using the first whitelist value; and
    applying the first whitelist value to the first compensation module when the reevaluated performance level is above the performance level threshold.

12. The method of claim 11, further comprising:
    setting, by the control module, a second setting of a second compensation module of the receiver with a second whitelist value in further response to determining that the performance level of the receiver is below the performance level threshold, the second compensation module to control a second characteristic of the receiver, the second whitelist value from a plurality of second values of the second setting, and the second whitelist value stored in the memory in combination with the first whitelist value, wherein the reevaluating of the performance level of the receiver is further using the second whitelist value;

applying the second whitelist value to the second compensation module when the reevaluated performance level is above the performance level threshold; and a second compensation module with a second setting that selects a second value from among a plurality of second values for a second characteristic of the receiver;

wherein:
   the memory is further to store a second whitelist value from among the second values, the second whitelist value being stored in combination with the first whitelist value; and in further response to determining that the performance level is below the performance level threshold, the control module is to use the second whitelist value in combination with the first whitelist value to reevaluate the performance level of the receiver, and to apply the second whitelist value to the second compensation module when the reevaluated performance level is above the performance level threshold.

13. The method of claim 11, wherein the first whitelist value is a predetermined whitelist value that is stored in the memory when the receiver is manufactured.

14. The method of claim 11, wherein the first whitelist value is derived by the control module based upon runs of a training algorithm that trains the serial data interface to maximize the performance level.

15. The method of claim 11, wherein the first compensation module comprises one of a continuous time linear equalizer, an automatic gain control, and a decision feedback equalizer.

16. The method of claim 11, wherein the performance level is determined based upon a receiver eye diagram of a received signal by the receiver, the method further comprising:

generating, by the control module, the receiver eye diagram.

17. The method of claim 16, wherein the performance level is further determined based upon an eye height of the receiver eye diagram.

18. The method of claim 16, wherein the performance level is further determined based upon an eye width of the receiver eye diagram.

19. The method of claim 11, wherein the performance level is determined based upon a bit error rate of the serial data interface.

\* \* \* \* \*